United States Patent [19]

Gummelt et al.

[11] Patent Number: 4,642,600

[45] Date of Patent: Feb. 10, 1987

[54] DEVICE FOR INDICATING THE FULLY CHARGED STATE OF A BATTERY

[75] Inventors: Klaus Gummelt, Garbsen; Jurgen Schulz, Hunstetten; Klaus Salamon, Kelkheim; Heinrich Rabenstein, Frankfurt, all of Fed. Rep. of Germany

[73] Assignee: Varta Batterie A.G., Hanover, Fed. Rep. of Germany

[21] Appl. No.: 718,808

[22] Filed: Apr. 2, 1985

[30] Foreign Application Priority Data

Apr. 18, 1984 [DE] Fed. Rep. of Germany ....... 3414664

[51] Int. Cl.[4] .......................... H01L 7/00; H02J 7/04
[52] U.S. Cl. ....................................... 338/34; 320/35; 320/48
[58] Field of Search ...................... 338/34; 320/35, 36, 320/46, 48; 429/86, 91

[56] References Cited

U.S. PATENT DOCUMENTS 4,098,964 7/1978 Reber ..................................... 429/86

FOREIGN PATENT DOCUMENTS 5725678 2/1982 Japan .

Primary Examiner—E. A. Goldberg
Assistant Examiner—Linda M. Peco
Attorney, Agent, or Firm—Weiser & Stapler

[57] ABSTRACT

The temperature rise associated with the catalytic recombination of battery gases at the end of the charging process is converted into an electrical signal suitable for checking and controlling charging, in a temperature-sensitive component such as a commercially available NTC or PTC resistor coated with a PTFE-bound palladium-activated carbon mixture. An additional activated carbon layer protects the catalyst from poisoning by the stibine present in the battery gases.

7 Claims, 2 Drawing Figures

DEVICE FOR INDICATING THE FULLY CHARGED STATE OF A BATTERY

BACKGROUND OF THE INVENTION

The present invention pertains to a device for indicating the fully charged state of a battery, especially a lead-acid storage battery, by determining the temperature of a recombination catalyst.

It is known that both excessively strong and excessively weak charging current levels are harmful to the life of a lead-acid storage battery. Generally, the charging of starter batteries and the like is controlled in accordance with voltage. However, voltage is not always a clear indication of the fully charged state because voltage is also influenced by other factors, such as by aging of the battery.

However, a lead-acid storage battery is always certain to be fully charged when oxygen and hydrogen evolve from the positive and negative electrodes in a stoichiometric ratio. Since this event is immediately imminent when a rise in temperature occurs in a hydrogen- and oxygen-recombining catalytic device, such a temperature signal has been used to control the charging process.

DE-OS No. 26 38 899 teaches that a lead-acid storage battery will generally lack approximately 10% of the amount of current needed for full charging at the time when the evolution of gas begins. This current is supplied in the form of an aftercharging current, the duration and intensity of which are set in a preselectable ratio with respect to the parameters of the original charging current. The time of the switch-over from the main charging phase to the aftercharging phase is determined by detecting the temperature rise occuring in a recombination device, which serves as a regulating variable.

To this end, DE-OS No. 30 20 606, which pertains to a data collection device for an automobile, teaches that a temperature signal sent from a catalytic converter is capable of being fed into a control circuit along with a battery voltage signal to provide such regulation.

SUMMARY OF THE INVENTION

The present invention has as its primary object to provide a device which operates on the principle of gas recombination, and which permits the heat of reaction induced by recombination to be detected promptly, without major measurement procedures, to convert the heat of reaction into a signal which can be received by a voltage regulator.

Fundamentally, a number of electronic components can serve such a purpose. The following are mentioned as illustrative examples: temperature-sensitive diodes; transistors; thermistors or hot-carrier thermistors, i.e. semiconductors whose electrical resistance is dependent on temperature in such a way that their conductivity increases in a hot state and decrease in a cold state; the so-called PTC resistors, which operate in the opposite sense; thermocouples based on poorly conducting copper-nickel alloys (constantan); or a platinum resistor, e.g. the "Platin 100" resistor, which has a defined resistance of 20 Ohms at 100° C. However, the use of such thermoelectric "sensors" is often limited by a chemically aggressive environment.

In practice it has been found that a hot-carrier thermistor, characterized by increasing electron transmission with rising temperature, also known as an NTC conductor (NTC=Negative Temperature Coefficient), is particularly advantageously used according to the present invention. As an alternative, one may use a PTC resistor, which operates as an electrical resistor at elevated temperature, but which is capable of switching off the charging current in accordance with the recombination reaction used. It is particularly advantageous to initially heat such a PTC resistor, to ensure that the recombination catalyst always remains dry, and that the recombination catalyst operates without delay at the end of the charging cycle.

These components are then coated with a catalytically active substance, in any of a number of different ways. However, it must always be ensured that at least the surface area of the component which extends between the contacts be kept free from metallic conducting material in order to prevent the formation of a short-circuit shunt. This is especially so in view of the use of a palladium catalyst, as is preferred in accordance with the present invention. The risk of forming a short-circuit shunt will occur, for example, in the case of galvanic application of a precious metal, if the deposition is carried out under conditions which are favorable to a high nucleation rate, i.e. high current density, high bath concentration, and high temperature. Masking of the surface areas to be protected with a lacquer is recommended in such case. Other processes for catalyst application are preferably preceded by coating of the hot-carrier thermistor or PTC resistor with a nonconducting plastic.

It is also advantageous to cover the catalyst-containing layer with an antimony-adsorbing layer in order to prevent premature poisoning of the catalyst due to the adsorption of antimony from the stibine which is inevitably present in the battery gases. Activated carbon serves as an especially effective adsorbent. The activated carbon can also be the actual carrier for the precious metal catalyst, if desired. The additional layer of activated carbon also serves as a diffusion barrier, to prevent explosions (an ignition breakthrough barrier).

Further detail regarding a device according to the present invention may be had with reference to the detailed discussion provided below, with reference to the following illustrations.

DETAILED DESCRIPTION OF PREFERRED EMBODIMENTS

Figure 1:
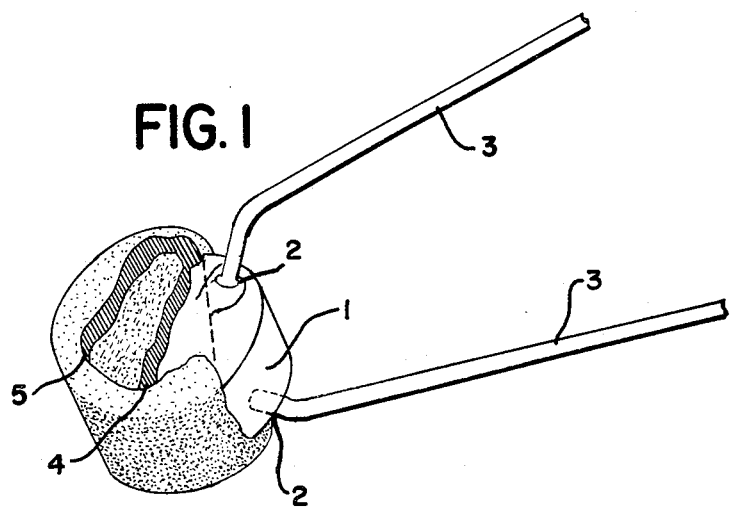
FIG. 1 is an enlarged prespective view, in partial section, of an NTC conductor prepared according to the present invention.

A commercially available design of the NTC conductor is that of a flat cylinder with a diameter of about 4 mm and a height of about 1.5 mm, having leads attached to top and bottom sides thereof. With reference to FIG. 1, such a hot-carrier thermistor 1 is covered with a thin plastic or lacquer coating so that the entire region around the lead-through points 2 of the leads 3 is left free from catalyst metal, in order to prevent short-circuit bridges from forming. In accordance with the present invention, the remainder of the hot-carrier thermistor 1 carries a catalyst layer 4 (preferably a carbon/palladium catalyst), which is in turn covered by an antimony-adsorbing activated carbon layer 5.

Figure 2:
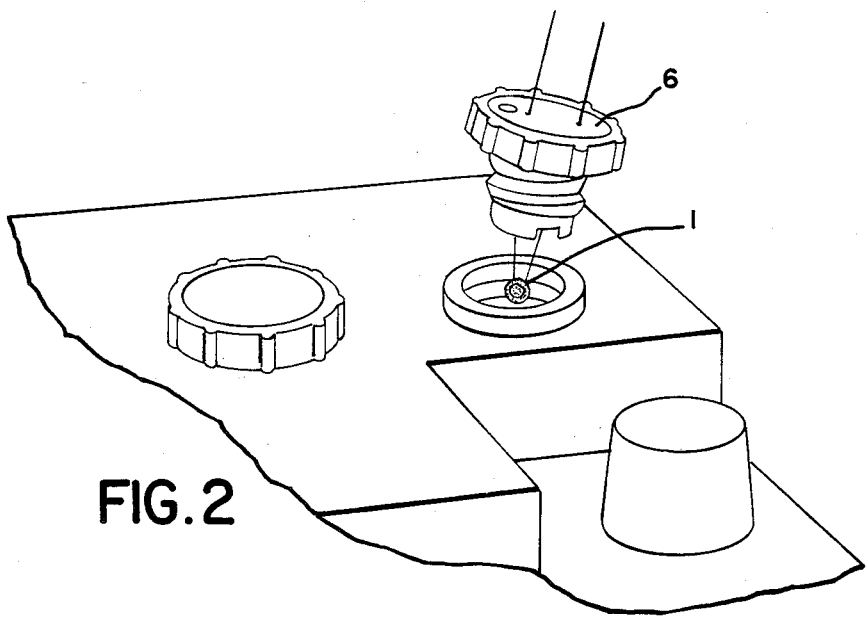
FIG. 2 is a fragmented, perspective view of a vent plug with an NTC conductor passing through it.

When placed in operative association with the battery, it is important for the temperature-sensitive component according to the present invention to be placed so as to be properly accessed by the gases evolved during battery charging, but so as to prevent the access of acid mist. With reference to FIG. 2, the hot-carrier thermistor 1 is, for example, preferably positioned underneath one of the gas release plugs 6 of the battery, so that the leads extend through holes provided in the release plug 6 as shown. The leads of the device are then coupled to an appropriate charging controller (not shown). NTC conductors according to the present invention are also advantageously placed in the gas collecting pipes associated with the cells of some types of batteries.

Catalyst coatings 4 according to the present invention for the hot-carrier thermistor 1 will now be explained in further detail, based upon two examples.

EXAMPLE 1

In a first step, the hot-carrier thermistor was coated with a thin insulating layer, by dipping into a synthetic resin. Alternatively, a PTFE or PVC coating can be applied in the form of a spray.

In a second step, the coated hot-carrier thermistor was then dipped into a paste, prepared by mixing 75 g activated carbon with 25 g PTFE in 100 mL $H_2O$, with 10 mL of a 5% $PdCl_2$ solution added. Contamination of the area around the contacts was avoided as previously described.

A third step was to dip the hot-carrier thermistor into a strongly reducing medium, e.g. a sodium borate solution. Palladium precipitates in this process in very finely dispersed form.

If desired, it is possible to then dip the prepared hot-carrier thermistor in an activated carbon paste which has been prepared, for example, for 100 g activated carbon powder and 160 mL of a 0.7% aqueous carboxymethyl cellulose (Tylose) solution.

The hot-carrier thermistor was ready for use after subsequent drying for 2 hours at 110° C.

EXAMPLE 2

The hot-carrier thermistor of Example 1 was again coated with a plastic layer.

Separately prepared was a mixture of 100 g activated carbon, 135 mL water, and 11 mL of a 5% $PdCl_2$ solution, mixed with 10 mL of a 30% sodium hydroxide solution in which 0.5 g sodium borate was dissolved, to reduce the $PdCl_2$. The hot-carrier thermistor was immersed into this paste while leaving free the contact areas, such that the catalyst material was applied in an already activated state. Drying was carried out at 100° C.

The catalyst-containing coating material was cemented onto the plastic-coated hot-carrier thermistor in the form of a pill.

Combining recombination and temperature indication in one small component has the advantage that the component can be manufactured at low cost, and requires very little space in use. Equally important is the fact that the response time of the device is very short due to the low heat capacity and the low heat transmission resistance between the recombination member and the temperature-sensitive component.

We claim:

1. A device for indicating the fully charged state of a storage battery, especially a lead-acid storage battery, by determining the temperature of a recombination catalyst, comprising a temperature-sensitive electronic component whose surface is provided at least partially with catalyst material, and is adapted for exposure to the battery gases, wherein the catalyst material is covered with an antimony-adsorbing layer.

2. The device of claim 1, wherein the electronic component is a temperature-sensitive resistor.

3. The device of claim 1, wherein the catalyst is a mixture of carbon and palladium.

4. The device of claim 1, wherein the antimony-adsorbing layer is comprised of activated carbon.

5. The device of claim 1, wherein the electronic component is coated with a nonconducting material at least in the region of the contacts of the electronic component.

6. A device for indicating the fully charged state of a storage battery, especially a lead-acid storage battery, by determining the temperature of a recombination catalyst, comprising a temperature-sensitive electronic component whose surface is provided at least partially with catalyst material which is comprised of a mixture of carbon and palladium, and is adapted for exposure to the battery gases.

7. The device of claim 6, wherein the electronic component is a temperature-sensitive resistor.

* * * * *